(12) United States Patent
Mehrl

(10) Patent No.: US 9,733,343 B2
(45) Date of Patent: Aug. 15, 2017

(54) PROXIMITY SENSOR ARRANGEMENT HAVING AN OPTICAL BARRIER TO PASS LIGHT TO A PHOTO DETECTOR VIA A COVER

(71) Applicant: ams AG, Unterpremstaetten (AT)

(72) Inventor: David Mehrl, Plano, TX (US)

(73) Assignee: AMS AG, Unterpremstaetten (AT)

( * ) Notice: Subject to any disclaimer, the term of this patent is extended or adjusted under 35 U.S.C. 154(b) by 87 days.

(21) Appl. No.: 14/647,423

(22) PCT Filed: Nov. 6, 2013

(86) PCT No.: PCT/EP2013/073176
§ 371 (c)(1),
(2) Date: May 26, 2015

(87) PCT Pub. No.: WO2014/082826
PCT Pub. Date: Jun. 5, 2014

(65) Prior Publication Data
US 2015/0323653 A1    Nov. 12, 2015

Related U.S. Application Data

(60) Provisional application No. 61/730,131, filed on Nov. 27, 2012.

(30) Foreign Application Priority Data

Nov. 30, 2012 (EP) ..................... 12194946

(51) Int. Cl.
*H03K 17/945* (2006.01)
*G01S 7/481* (2006.01)
(Continued)

(52) U.S. Cl.
CPC .......... *G01S 7/4814* (2013.01); *G01S 7/4813* (2013.01); *G01S 17/026* (2013.01); *G01S 17/32* (2013.01);
(Continued)

(58) Field of Classification Search
CPC ........ H03K 17/945; H03K 2217/94116; H01L 31/167; H01L 27/1462; H01L 27/323;
(Continued)

(56) References Cited

U.S. PATENT DOCUMENTS 8,704,152 B2 * 4/2014 Svajda .................. G01S 3/7803
250/221
8,957,380 B2 * 2/2015 Costello ................ G01S 7/4813
250/338.1
(Continued)

FOREIGN PATENT DOCUMENTS

EP    2728387 A1    5/2014
EP    2735891 A1    5/2014

*Primary Examiner* — Que T Le
(74) *Attorney, Agent, or Firm* — McDermott Will & Emery LLP

(57) ABSTRACT

A proximity sensor arrangement comprises an optical barrier being placed between a light emitting device and a photo-detector. The light emitting device, the photo-detector and the optical barrier are covered by a cover. The optical barrier is being designed to block light emitted from the light emitting device to the photo-detector and reflected by the cover by means of specular reflection. Furthermore, the optical barrier is being designed to pass the light emitted from the light emitting device to the photo-detector via the cover and scattered on or above a first surface of the cover facing away from the light emitting device and the photo-detector.

14 Claims, 4 Drawing Sheets

(51) Int. Cl.
  *G01S 17/32* (2006.01)
  *G01V 8/12* (2006.01)
  *H03K 17/94* (2006.01)
  *G01S 17/02* (2006.01)

(52) U.S. Cl.
  CPC .............. *G01V 8/12* (2013.01); *H03K 17/941* (2013.01); *H03K 2217/94108* (2013.01)

(58) Field of Classification Search
  CPC ........ G01S 7/4813; G01S 17/32; G01S 7/481; G01S 17/026
  USPC ..................... 250/221, 216, 239, 551, 214.1; 340/539.23, 555–557
  See application file for complete search history.

(56) References Cited

U.S. PATENT DOCUMENTS

| | | |
|---|---|---|
| 2008/0006762 A1 | 1/2008 | Fadell et al. |
| 2008/0296478 A1 | 12/2008 | Hernoult |
| 2010/0124945 A1 | 5/2010 | Hwang et al. |
| 2010/0258710 A1 | 10/2010 | Wiese et al. |
| 2011/0057130 A1 | 3/2011 | Hsu et al. |
| 2011/0204233 A1 | 8/2011 | Costello et al. |
| 2011/0248151 A1 | 10/2011 | Holcombe et al. |
| 2012/0129579 A1 | 5/2012 | Tam |
| 2012/0295665 A1 | 11/2012 | Pantfoerder |

\* cited by examiner

PROXIMITY SENSOR ARRANGEMENT HAVING AN OPTICAL BARRIER TO PASS LIGHT TO A PHOTO DETECTOR VIA A COVER

This application relates to a proximity sensor arrangement.

BACKGROUND OF THE INVENTION

Optical proximity sensors are widely used in products such as cell phones and smartphones for detecting proximity to a human head. These sensors often use infra-red (IR) light emitting diodes (LEDs) and optical sensors like photodiodes. The sensor detects the amount of IR light that is reflected from the proximity target, e.g. as the ear area of a human head as a phone is brought into close proximity to the sensor. Proximity detection can be used to trigger response in the phone such as turning off the cell phone screen, in order to conserve cell phone battery power.

A problem, however, can occur when the cell phone is pressed hard against the head of a person who has very dark and dense hair. In such case the hair absorbs most of the incident IR light emitted from the LED, and the small amount of IR light that is reflected eventually has no optical path back to the detector. Although black hair does reflect some IR light, optical apertures in the cover glass—typically used to protect proximity sensors—are physically separated. When a dark object such as black hair is pressed tightly against the glass, the dark object may obstruct the light path, blocking any reflected IR light from reaching the aperture over the sensor. In addition to black hair, similar problems can occur when the phone is placed against the side of the head of someone wearing a stocking cap or other object that can occlude any reflected IR light from reaching the detector. With very dense opaque objects, the problem can also occur with light coloured objects, since they can prevent reflected light passing through the LED aperture, from reaching the sensor aperture, by virtue of being opaque.

The result is that the sensor detects no proximity signal, and electronics in the phone erroneously conclude that there is no nearby proximity target. In response the cell phone turns the screen back on, wasting precious battery energy, while the cell phone user continues using his phone.

In most cell phone designs (due to design reasons) the IR LED and optical sensor are required to reside behind the cell phone's cover glass, in order to render these optical parts invisible. On the other side part of the design of a cell phone proximity sensor must address the issue of optical crosstalk, which occurs when light reflects from the inside and/or outside surfaces of the cell phone's cover glass due to Fresnel reflection at the glass surfaces. The same measures, however, used to minimize optical crosstalk typically give rise to the inability to detect dark objects placed on or nearly against the glass.

A common approach on improving black hair response is to design the optics such that the critical point lies just outside of the glass outer surface. The critical point characterizes the point where proximity detection first occurs as one proceeds along the z direction, i.e. the axis perpendicular to the glass surface. This occurs when the emission cone of the LED first intersects with the detection cone or field of view of the detector. A shortcoming of this approach is that often the critical point is far from being an infinitesimally small point, and is generally distributed in space, as the emission/detection cones seldom go to zero abruptly at their outer extents. A consequence is that placing the critical point just outside the outer glass surface, so as to detect black hair lying against the outer surface, generally results in some proximity detection of the glass outer surface (being ~4% reflective) but resulting in significant undesirable optical crosstalk. An additional concern relates to manufacturing tolerances, whereby variations in sensor to glass or LED to glass spacing, or part to part variations in LEDS as the LED divergence angle can often vary significantly with low cost LEDs and may result in the critical point lying inside the glass, such that there can be significant yield losses in cell phones due to increased optical crosstalk.

Because of the above described problems in optical proximity sensor design, industry has developed standards to be passed by a given sensor arrangement. For example, a sensor is required to pass a black card test. A sensor arrangement passes the black card test if it produces a proximity signal under standardized conditions. The test involves a card of defined low reflectivity which simulates dark objects and is positioned on top of the cover at zero distance.

In conclusion, there is a need in the art to provide an optical proximity sensor that allows for improved detection of objects placed close against its cover, yet allows suppressing of optical crosstalk.

SUMMARY OF THE INVENTION

A proximity sensor arrangement according to the present principle comprises an optical barrier which is being placed between a light emitting device and a photo-detector. The light emitting device, the photo-detector and the optical barrier are covered by a cover, in particular, made of glass or plastics.

The optical barrier is designed based on different competing principles. On one side the barrier is used to reduce optical crosstalk between the light emitting device and the photo-detector. For example, as the barrier is placed between the light emitting device and the photo-detector it effectively blocks direct emission from the light emitting device towards the photo-detector. On the other side, however, crosstalk may also arise via indirect paths via the cover. This constrains the geometry of the optical barrier which has to open at least some optical paths to allow for sensor operation.

Thus, the optical barrier is further designed to block light emitted from the light emitting device to the photo-detector which gets reflected by the cover by means of specular reflection. Specular reflection is the mirror-like reflection of light from a surface according to the law of reflection, i.e. light from a single incoming direction is reflected into a single outgoing direction.

In addition, the optical barrier is designed to pass light emitted from the light emitting device to the photo-detector via the cover and scattered on or above a first surface of the cover facing away from the light emitting device and the photo-detector.

The optical barrier constructed along the design constraints discussed above improves the detection of objects like dark hair placed on or in small distance to the cover. At the same time the design features improved crosstalk reduction. The black card test as discussed in the introduction can be passed more easily. The proposed design further diminishes the need of using an optical design employing a critical point placed slightly above the cover. By appropriately adjusting the optical barrier it is possible to frustrate most or all of specular reflection paths from the light emitting diode to the photo-detector via the cover surfaces (in particular, made of glass or plastics), while allowing indirect, diffusively scattered paths to pass.

The term "light" hereinafter includes electromagnetic radiation covering the infrared, visible and ultra violet spectrum. In particular, however, the light emitting device emits in the (near) infrared. The term "between" within the meaning of this application is used to characterize the fact that some optical paths are spatially interrupted by means of the optical barrier. The photo-detector, light emitting device and optical barrier do not necessarily need to be placed in the same plane as will be discussed in the context of aperture arrangements below. For example, the optical barrier may reside anywhere between the light emitting device and the photo-detector with respect to the cover, such as residing just above or downstream light emitting device and the photo-detector facing towards the cover, and, for example, having a gap between the optical barrier and the cover.

According to another aspect of the invention, the optical barrier extends along a first principal axis being essentially parallel to the first surface of the cover. The extent along the first principal axis is arranged such that light scattered on or above the first surface of the cover can pass around the optical barrier to reach the photo-detector.

Using a rather narrow barrier extending along the first principal axis blocks specular rays reflected off the cover. Rays emitted by the light emitting device, however, that strike a target to be detected, for example a black card surface or dark hair, can go around the optical barrier. In fact, some of the scattered rays, which have no preferred direction, can reach the photo-detector. A narrow barrier, i.e. one having the extent in x axis adjusted as described above, allows for improved black card and/or dark object detection. If, however, a wide optical barrier was used, it would block all light.

According to another aspect of the invention, the light-emitting device emits light, in particular infrared light, into an emission cone. The emission cone may be determined by the light-emitting device or be altered by a lens attached to the device. The optical barrier is designed to intersect the emission cone such that essentially no light reaches the photo-detector by way of specular reflection via the cover and/or by means of direct emission.

According to another aspect of the invention, the optical barrier extends along its first principal axis at least as much to block the emission cone emitted by the light-emitting device. The term "narrow" as used in this application specifies a spatial extent of the optical barrier sufficient to intersect with the emission cone of the light-emitting device such that specular reflections via the cover are blocked.

According to another aspect of the invention, the optical barrier comprises a three-dimensional column-shaped barrier. The column shape provides a mechanically robust and easy way of production. The actual shape can be determined from optical ray tracing simulations.

According to another aspect of the invention, the light-emitting device, the photo-detector and the optical barrier are positioned within a first plane. The optical barrier extends at least along a second axis being orthogonal with respect to the first plane and is directed towards the cover.

According to another aspect of the invention, the column-shaped body of the optical barrier comprises a flared profile, in particular a flared base by which the column-shaped body is mounted onto the first plane. A flared profile offers both improved mechanical robustness and easier way of production. A given profile may be determined by optical ray tracing simulations. The only constraint to such profiles lies in the general geometrical principles of optical barriers presented above.

According to another aspect of the invention, the first plane comprises a printed circuit board. Via the printed circuit board the light emitting device and photo-detector are electrically connected with further electronic components. These further electronic components may be integrated on the same board, for example as an integrated circuit, or may establish connections to separate components of a larger device, such as a cell phone or Smartphone. According to another aspect of the invention the optical barrier comprises an essentially two-dimensional aperture arrangement, in particular extending along a first and along a third principal axis. The aperture arrangement is essentially parallel to the second surface of the cover. The aperture arrangement can be implemented instead or in addition to an optical barrier placed in on a plane together with the light emitting device and the photo-detector. If, however, the aperture arrangement is employed it is preferred to use it together with the latter optical barrier to reduce crosstalk caused by direct emission between the light emitting device and the photo-detector.

The aperture arrangement can be placed anywhere between the pair comprising the photo-detector and light emitting device on one side, and the cover on the other side, such as residing above the pair of photo-detector and light emitting device. The actual position is restricted by the design constraints discussed above. For example, the aperture arrangement can be placed downstream the light emitting device and the photo-detector, facing towards the cover. In this case, a gap between the optical barrier and the cover can be provided for improved mechanical stability. The aperture arrangement may comprise a plastic or metal sheet, a (black) ink, dye or paint structure.

According to another aspect of the invention, the second plane comprises the second surface of the cover facing towards the light-emitting device and the photo-detector. The aperture arrangement at least partly covers the second surface.

According to another aspect of the invention the aperture arrangement comprises a translucent material, in particular an ink. The ink may be based on pigment particles or dyes. The material can be chosen to be transmissive to infrared, for example >80%, and largely opaque only to visible light, for example transmission <10%.

According to another aspect of the invention the aperture arrangement comprises at least one aperture being transmissive to the light emitted by the light-emitting device and a mask being essentially opaque to the light emitted by the light-emitting device.

According to another aspect of the invention the light-emitting device comprises a light-emitting diode, an infrared light-emitting diode or a laser.

According to another aspect of the invention the photo-detector comprises a photodiode, a charge-coupled device or a complementary metal oxide semiconductor.

BRIEF DESCRIPTION OF THE DRAWINGS

In the following, the principle presented above will be described in more detail with respect to drawings in which exemplary embodiments are presented.

DETAILED DESCRIPTION

Figure 1A:
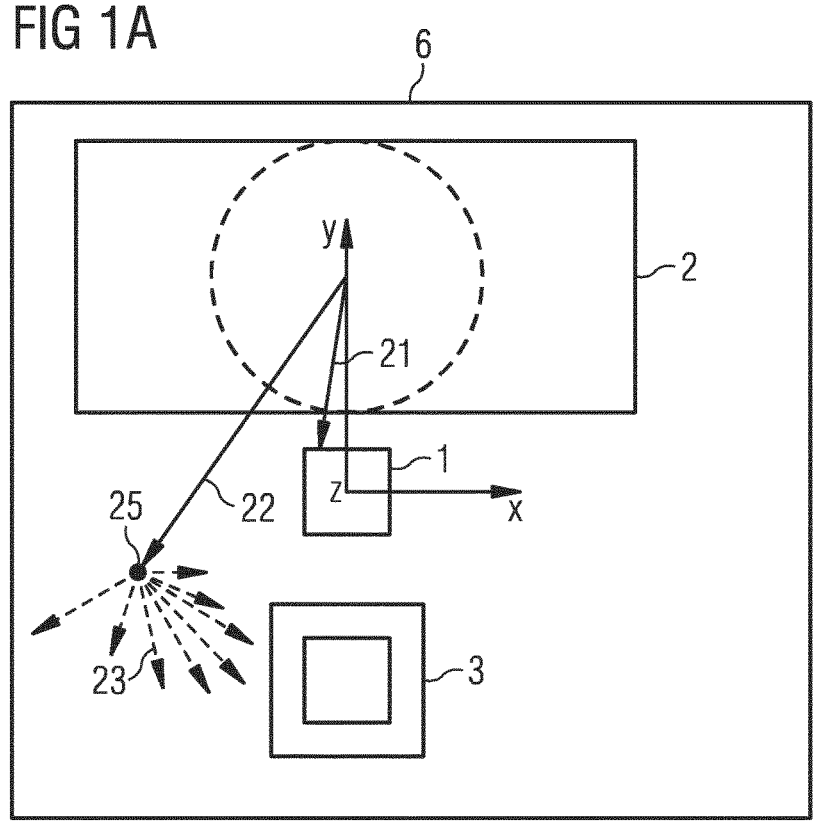
FIG. 1A shows a top view of an exemplary embodiment of a proximity sensor arrangement according to the principle presented.

FIG. 1A shows a top view of an exemplary proximity sensor arrangement according to the principle presented. The sensor arrangement comprises a light emitting device 2, which in particular, is an infrared light emitting diode, and a photo-detector 3 like a charge-coupled device or a photo-diode. These sensor components are mounted on top of a printed circuit board 6 to which they are electrically connected. The printed circuit board 6 defines an x, y plane arranged along principal axes x and y. In particular, the optical barrier 1, the light emitting device 2 and the photo-detector are mounted on the printed circuit board 6 inline with the principal axis y.

Placed between the photo-detector 3 and the light-emitting device 2 is an optical barrier 1. The optical barrier 1 comprises a three-dimensional body extending along the principal axes x and y but also along a third principal axis z which is orthogonal with respect to the x, y plane. The optical proximity sensor arrangement is covered by a cover 4 which is not shown in this representation (see FIG. 1B). In particular, the cover 4 is transparent to IR light and made of glass or plastics.

The physical dimensions of the optical barrier 1, the light emitting device 2 and the photo-detector are not arbitrarily chosen with respect to each other. In fact, the geometry of the optical barrier 1 is constrained by the other components and their relative positions. A guideline for choosing the actual dimensions is to achieve reliable detection of close proximity objects eventually having low reflectivity and, at the same time, reduce optical crosstalk.

Figure 1B:
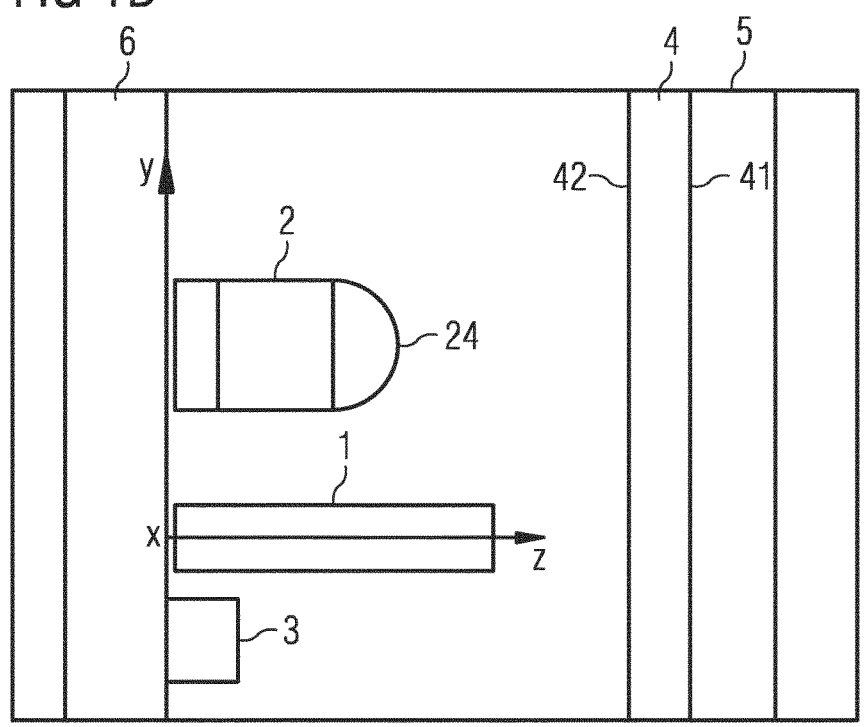
FIG. 1B shows a side view of an exemplary embodiment of a proximity sensor arrangement according to the principle presented.

Optical crosstalk in the proximity sensor arrangement may arise from specular reflections off of cover surfaces 41, (see FIG. 1B). Specular reflections are mirror-like reflections where the angle of reflection equals the angle of incidence (law of reflection). On the other side close proximity objects and black cards from industry standard test constitute rather diffuse reflectors which scatter light in all directions.

To account for these observations the optical barrier 1 is made narrow in the x axis extent, in fact, as much as to frustrate specular reflection paths from the light emitting device 2 to the photo-detector 3 via cover surfaces 41, 42. In particular, the extent of the optical barrier 1 is made narrow enough to block all specular rays 21 reflected off of the surfaces of the cover 4 (not shown).

Furthermore, the optical barrier 1 also blocks the emission cone of the light emitting device 2. In a certain sense the photo-detector 3 sees no light from the light emitting device 2 by way of direct or specularly reflected optical paths. However, the optical barrier 1 is only so narrow (in x direction) that rays allowed to go around the barrier by indirect or diffusively scattered paths via diffuse scattering.

Rays reflected above the outer surface 41 of cover 4 can still reach the photo-detector 3 and lead to proximity detection signal.

In operation, the light-emitting device 2 emits or flashes rays of light 21, 22 into the cover 4. If a proximity object like a human head is placed in front of the sensor arrangement, i.e. above an outer surface of the cover 4, light may be reflected from the object back into the cover 4. If the light reaches the photo-detector 3 a proximity event can be indicated by producing a characteristic proximity signal.

Because of the narrow size along the x axis the optical barrier 1 blocks direct and indirect optical reflection paths from the light-emitting diode 2 towards the photo-detector 3 as described above. If, however, light gets scattered back on or above the cover surface 41, light rays can reach the photo-detector 3 by means of scattering (this is indicated as a dot 25 in the drawing). This allows for detection of objects placed on the outer surface 41 of the cover 4 or in close distance thereto. If a wider barrier was used, e.g. one that would block also indirect scattered light and not fulfilling the geometry constrains discussed above, such objects would eventually not be detectable as will be shown below. The narrow optical barrier 1, however, even allows improved black card detection.

FIG. 1B shows a side view of an exemplary embodiment of a proximity sensor arrangement according to the principle presented. The drawing shows the sensor components arranged in the x, z plane. The optical barrier 1 is placed on the printed circuit board 6 such as to reduce crosstalk between the light emitting device 2 and the photo-detector either by direct emission or by reflection via one of the surfaces 41, 42 of cover 4. In fact, each of the surfaces 41, 42 typically gives rise to reflection of 4% of light hitting the cover/air interfaces. The optical barrier 1 has a certain extent in z direction which is constrained by design considerations. The actual choice of extent in z direction is made on a balance between crosstalk reduction and detection performance. The optical barrier 1 thus may or may not be connected with the cover 4. It may be advisable to keep the z extent lower so that a gap between the barrier and cover remains. This prevents damaging the sensor arrangement if some sort of force acts on the cover 4.

Different types of light emitting devices are available in the market. In FIG. 1B an IR light emitting diode 2 is shown having a lens 24 mounted on top of it. The lens 24 can be used to focus the light into a tight emission cone such that crosstalk and divergence is low so most rays can be used for proximity detection.

The photo-detector 3 is matched to the light emitting device 2 in the sense that it needs to able to detect the type of light which is emitted by the light emitting device. In a preferred embodiment, emission is in the near IR and the common detectors can be used as most of these are sensitive in the red and IR. However, to improve detection further detectors with higher sensitivity to IR can be used. Other wavelengths for emission and detection can be used as well. It is only due to design reasons IR is chosen as this kind of electromagnetic radiation is invisible to the naked eye and relatively easy to implement. The general principle, however, applies to other wavelengths as well, e.g. UV/vis.

Shown is also a sense proximity target 5 attached to the outer surface 41 of the cover 4. This target may be a 90% reflective Kodak card (typically 100 mm×100 mm in size), or it may be a 5% reflective black card placed against the cover to simulate black hair.

In this exemplary embodiment the cover 4 is made of glass 0.7 mm thick, with dark ink on its inside which is 75%

IR transmissive, but only about 10% transmissive to visible light. This is to camouflage the sensor parts. Typical IR light emitting diode is used having lens 24 with 0.6 mm radius of curvature to focus the IR light. A TSL2772 sensor is used as photo-detector. The spacing between the photo-detector and light emitting device 2 is 3.35 mm on center. The glass to sensor gap is about 3.3 mm.

Figure 2A:
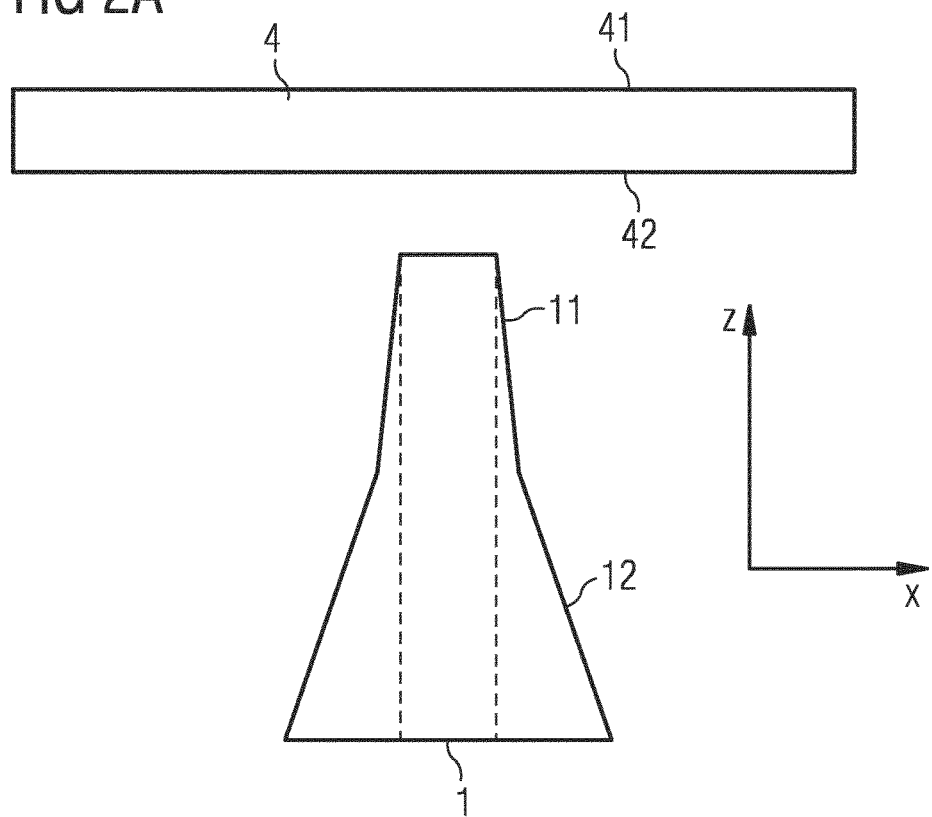
FIGS. 2A and 2B show exemplary embodiments of column-shaped optical barriers according to the principle presented.
Figure 2B:
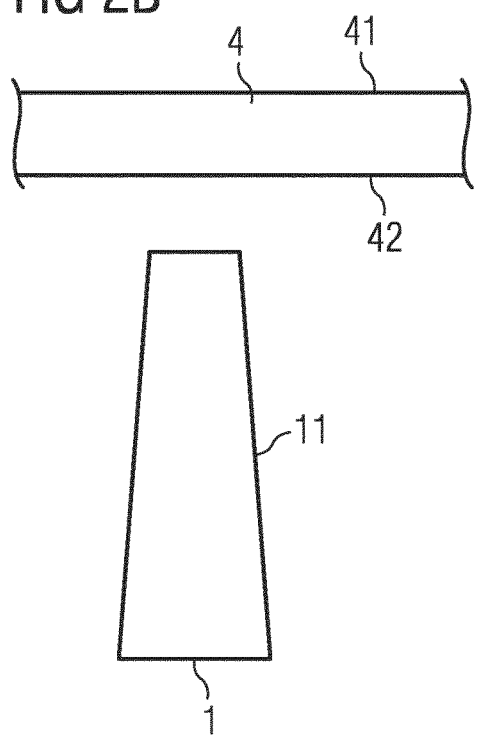

FIGS. 2A and 2B show exemplary embodiments of column-shaped optical barriers according to the principle presented.

FIG. 2A shows a column design having a flared profile. The optical barrier comprises a head area 11 facing the inner surface 42 of the cover 4. The barrier further comprises a base area 12 by which the barrier 1 is mounted onto the printed circuit board 6. FIG. 2B shows a different view onto the column. Seen from a different angle (here: rotated about 90 degrees) the shape is more regular and the column has a head area 11 which passes into the base. In a further embodiment, not shown, the column may have an overall regular or cone-like shape.

The column-shaped optical barriers of FIGS. 2A and 2B are more practical implementations than a single cylindrical column. They offer improved mechanical stability and are easier to manufacture, for example, they have better mold release due to draft angle. Apart from being differently shaped they feature the same functionality as discussed above with respect to more general optical barrier geometry. The actual design is not constrained to the ones depicted here. Practical shapes can be obtained from simulations like TracePro. This way the shape can be designed to be manufacturable and mechanically robust, but will provide similar optical results since the portion of the barrier near the cover is unchanged (see dashed rectangular area in FIG. 2A, for example).

Figure 3A:
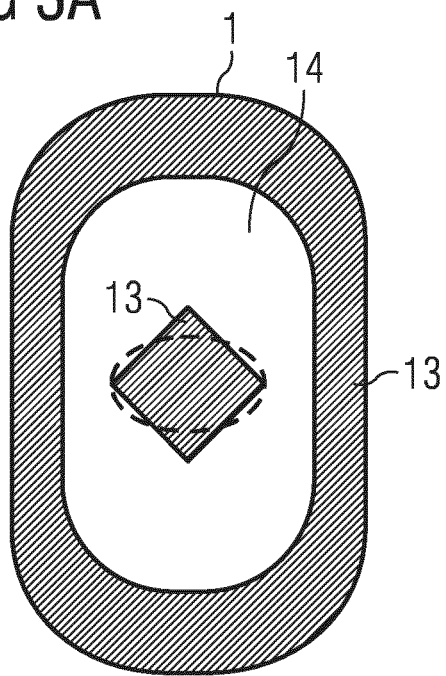
FIGS. 3A and 3B show exemplary embodiments of aperture arrangements according to the principle presented.
Figure 3B:
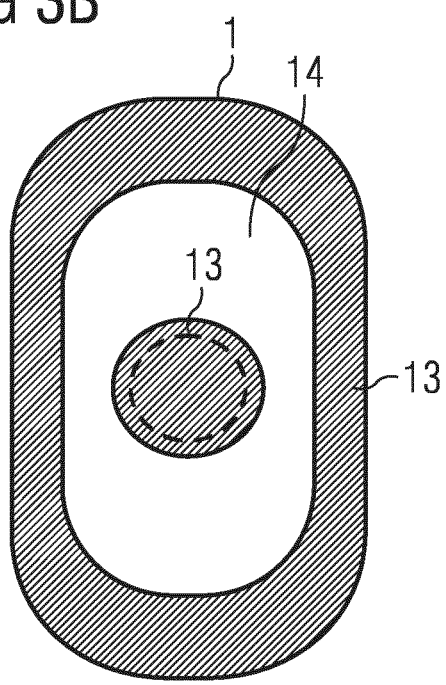

FIGS. 3A and 3B show exemplary embodiments of aperture arrangements according to the principle presented. Instead or in addition to a column-shaped optical barrier 1 the barrier can be based on an aperture arrangement on the inner surface 42 of the cover 4.

Two examples are shown in FIGS. 3A and 3B, respectively. Depicted are top views of two similar optical barriers 1 realized as aperture arrangements. The aperture arrangements are basically two-dimensional ink patterns painted on the inner surface 42. The aperture arrangements comprise a mask 13 based on an optically opaque material. At the same time the mask should have a low reflectivity to light in order to further reduce optical crosstalk. Suitable materials comprise black paint, inks, dyes, and plastic- or metal-sheets. Furthermore, apertures 14 comprise a material which is transmissive to the light emitted from the light emitting device 2. In particular, due to design reasons, the aperture 14 material blocks other light wavelengths. For example, the aperture may comprise a black ink being 80% transmissive to IR and only 15% transmissive to visible light.

Thus, the "black ink" apertures 13 painted on the inside of the cover can be used to suppress those rays that would contribute to optical crosstalk via specular reflection off of the surfaces 41, 42 of the cover 4. In fact, often the outer surface 41 creates the most crosstalk, as it often provides enough working distance for emitted rays to be specularly reflected from the outer surface 41, typically a 4% reflection, and then bounce directly to the active area of photo-detector 3.

The area on the surface(s) which should be left open with the aperture 14 can be identified from optical ray tracing simulation, and the opaque ink mask 13 can then be designed to block and/or absorb specular reflection ray paths, while allowing other non specular reflection paths to pass around the ink area. Generally, the same design principles apply as discussed with respect to three-dimensional optical barriers above. The ink-based optical barriers of FIGS. 3A and 3B control optical crosstalk. The apertures 14 in the ink mask 13 are "open" to provide a path for diffuse path rays, so that dense and low reflecting objects close to the cover surface 41 or the black card test can be passed.

The concepts are similar in that the ink mask 13 applied to the inner surface 42 is designed to block/absorb any specular optical path rays that would ordinarily reflect from the outer surface 41 of the cover 4. Any back scattered light due to 4% reflectance is scattered diffusely, instead of specularly reflected via the cover 4. The mask 14 between the light emitting device 2 and photo-detector 3 aperture provides optical crosstalk suppression. The mask 14 is provided where it is needed to block specularly reflected rays that would otherwise emit from the light emitting device 2 and specularly reflect off of the inner or outer surfaces 41, 42 of the cover 4. The other regions can be left open to form the apertures 14 and allow the non-specular rays to reflect from the proximity object or black card and diffusely scatter to the photo-detector 3. Actual design can be found by ray tracing simulations such as TracePro.

Figure 4A:
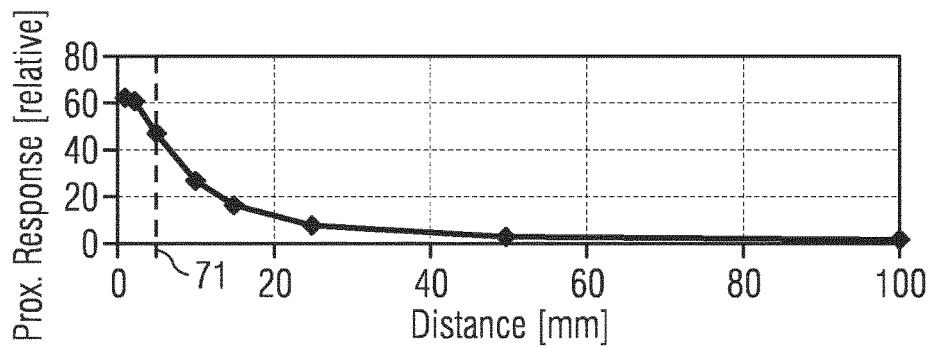
FIGS. 4A, 4B and 4C show exemplary simulated detection characteristics of a proximity sensor arrangement according to the principle presented.
Figure 4B:
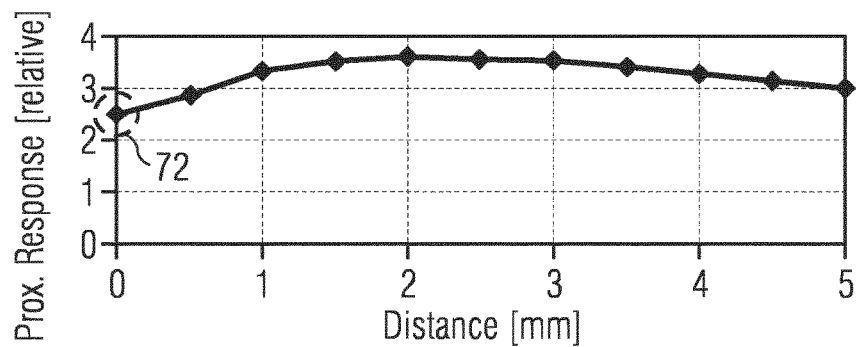
Figure 4C:
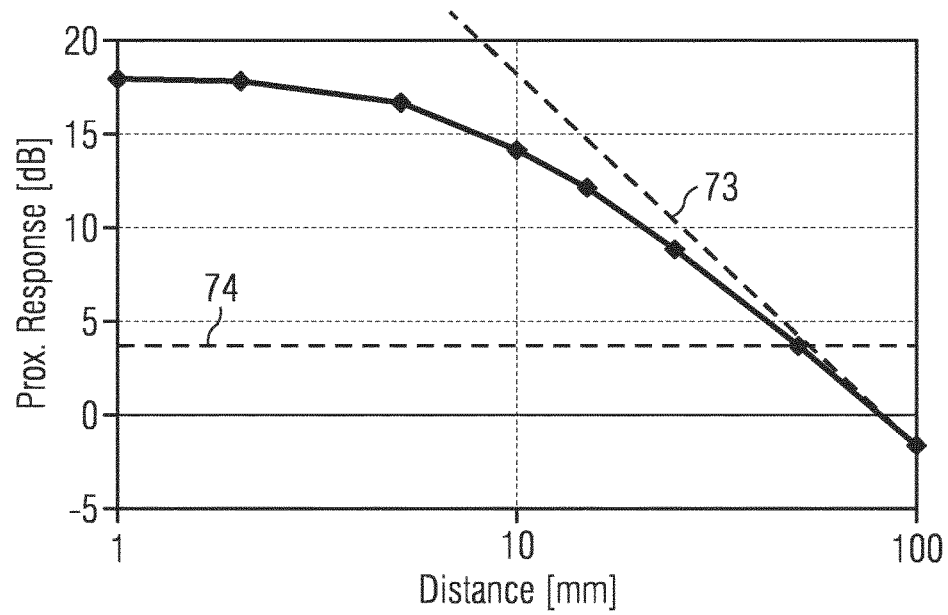

FIGS. 4A, 4B and 4C show exemplary simulated detection characteristics of a proximity sensor arrangement according to the principle presented. The performance of the proposed proximity sensor arrangement can be simulated. Table 1 summarizes the results of raw simulation data using a 1 W infrared light emitting diode source (arbitrarily chosen at 1 W for convenience).

TABLE 1 simulation data of sensor performance

| d [mm] | response [μW] | log(d) | response [dB] |
| --- | --- | --- | --- |
| 1 | 62.50 | 0.00 | 17.96 |
| 2 | 61.40 | 0.30 | 17.88 |
| 5 | 47.30 | 0.70 | 16.75 |
| 10 | 26.40 | 1.00 | 14.22 |
| 15 | 16.00 | 1.18 | 12.04 |
| 25 | 7.55 | 1.40 | 8.78 |
| 50 | 2.32 | 1.70 | 3.65 |
| 100 | 0.65 | 2.00 | −1.87 |
| 0 | 2.50 | — | 3.98 |
| 0 | 0.01 | — | −20.46 |

The simulation further assumes a proximity target 6 placed at distance d with respect to the outer surface 41 of the sensor arrangement. As proximity sensor are typically measured against industry standards the proximity target is chosen to be a Kodak card of 90% reflectivity. Furthermore, in order to simulate black targets of low reflectivity at small distances a black card (industry standard) of 5% reflectivity having a diffusively reflective surface was placed right on top of the outer surface 41 of cover 4, i.e. distance d=0 mm. The simulation further assumes a narrow optical barrier having the design properties discussed with respect to FIGS. 1A and 1B. For the sake of comparison the last line of Table 1 shows a simulation result based on a wide optical barrier blocking all scattered rays from the cover.

Using the wide barrier with black card test results in a virtual zero response. Using the narrow barrier provides a response that is about equivalent to the normal Kodak Card response at a distance of 50 mm. Consequently with the narrow barrier, the 5% black card test easily passes.

Finally, with no proximity target and no black card, the optical crosstalk response (using narrow barrier) is only 12 pW or 0.012 µW, thus the narrow barrier effectively squelches the optical crosstalk due to specular reflections off of the inside/outside glass surfaces 41, 42.

The results are graphically depicted in FIG. 4A showing the proximity response of the Kodak card (in relative arbitrary units) as a function of distance d. Part 71 of the representation is shown in FIG. 4B in more detail. Circle 72 shows the response if the black card is used as proximity target at distance d=0.

FIG. 4C shows the detector response in dB units in a log-log representation to enhance the dynamic range. The proximity sensor can easily detect proximity targets at d=100 mm. The dashed line 73 depicts the characteristic $1/d^2$ proximity response versus distance d. It can be seen that the proximity response asymptotically approaches this characteristic response. The response at d=0 with narrow barrier is shown at reference numeral 74. The intersection of both dashed lines 73, 74 indicate the response to the 5% diffuse reflective black card placed against the cover is equivalent to the proximity response of the standard 100 mm×100 mm, 90% reflective Kodak card placed at a 50 mm distance (see Table 1). Hence the optical system is capable of passing the black card test, and can be expected to detect black hair or similarly dark and low reflecting targets pressed against the cover.

The invention claimed is:

1. A proximity sensor arrangement, comprising an optical barrier being placed between a light emitting device and a photo-detector, wherein
    the light emitting device, the photo-detector and the optical barrier are covered by a cover;
    the optical barrier is configured to block light emitted from the light emitting device to the photo-detector and reflected by the cover by means of specular reflection;
    the optical barrier is configured to pass the light emitted from the light emitting device to the photo-detector via the cover and scattered on or above a first surface of the cover facing away from the light emitting device and the photo-detector, and
    the optical barrier is configured narrow enough to frustrate specular reflection paths from the light emitting device to the photo-detector via the cover surfaces, while permitting rays to pass around the barrier by indirect or diffusely scattered paths via diffusive scattering on or above the first surface of the cover.

2. The proximity sensor arrangement of claim 1, wherein
    the optical barrier extends along a first principal axis being essentially parallel to the first surface of the cover; and
    the extent along the first principal axis is arranged such that light scattered on or above the first surface of the cover is permitted to pass around the optical barrier to reach the photo-detector.

3. The proximity sensor arrangement of claim 1, wherein
    the light emitting device emits light, in particular infrared light, into an emission cone; and
    the optical barrier is configured to intersect the emission cone such that essentially no light reaches the photo-detector by way of specular reflection via the cover and/or by means of direct emission.

4. The proximity sensor arrangement of claim 3, wherein the optical barrier extends along its first principal axis at least as much to block the emission cone emitted by the light emitting device.

5. The proximity sensor arrangement of claim 1, wherein the optical barrier comprises a three-dimensional column-shaped body.

6. The proximity sensor arrangement of claim 1, wherein
    the light emitting device, the photo-detector and the optical barrier are positioned within a first plane; and
    the optical barrier extends at least along a second axis being orthogonal with respect to the first plane and directed towards the cover.

7. The proximity sensor arrangement of claim 6, wherein the column shaped body comprises a flared profile, in particular a flared base by which the column shaped body is mounted onto the first plane.

8. The proximity sensor arrangement of claim 6, wherein the first plane comprises a printed circuit board.

9. The proximity sensor arrangement of claim 2, wherein
    the optical barrier comprises an essentially two-dimensional aperture arrangement, in particular extending along the first and along a third principal axis; and
    the aperture arrangement is essentially parallel to a second surface of the cover.

10. The proximity sensor arrangement of claim 9, wherein
    the second plane comprises the second surface of the cover facing towards the light emitting device and the photo-detector; and
    the aperture arrangement at least partly covers the second surface.

11. The proximity sensor arrangement of claim 9, wherein the aperture arrangement comprises an opaque material, in particular an ink.

12. The proximity sensor arrangement of claim 9, wherein the aperture arrangement comprises
    at least one aperture being transmissive to the light emitted by the light emitting device; and
    a mask being essentially opaque to the light emitted by the light emitting device.

13. The proximity sensor arrangement of claim 1, wherein the light emitting device comprises a light emitting diode, an infrared light emitting diode or a laser.

14. The proximity sensor arrangement of claim 1, wherein the photo-detector comprises a photo-diode, a charge coupled device, or a complementary metal-oxide semiconductor.

* * * * *